(12) United States Patent
Sade

(10) Patent No.: US 9,214,346 B2
(45) Date of Patent: Dec. 15, 2015

(54) APPARATUS AND METHOD TO REDUCE PARTICLES IN ADVANCED ANNEAL PROCESS

(71) Applicant: Applied Materials, Inc., Santa Clara, CA (US)

(72) Inventor: Amikam Sade, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 36 days.

(21) Appl. No.: 13/849,097

(22) Filed: Mar. 22, 2013

(65) Prior Publication Data

US 2013/0280923 A1    Oct. 24, 2013

Related U.S. Application Data

(60) Provisional application No. 61/635,136, filed on Apr. 18, 2012.

(51) Int. Cl.
| | |
|---|---|
| *B23K 26/06* | (2014.01) |
| *B23K 26/00* | (2014.01) |
| *H01L 21/268* | (2006.01) |

(52) U.S. Cl.
CPC .......... *H01L 21/268* (2013.01); *B23K 26/0042* (2013.01); *B23K 26/063* (2013.01); *B23K 26/0661* (2013.01); *B23K 2201/40* (2013.01)

(58) Field of Classification Search
CPC .......... B23K 26/0661; B23K 26/0042; B23K 26/0656; B23K 26/06
USPC ............. 219/121.65, 121.73, 121.79, 121.86, 219/121.61, 121.78, 121.67; 355/75
See application file for complete search history.

(56) References Cited

U.S. PATENT DOCUMENTS 4,131,363 A * 12/1978 Shea et al. ...................... 355/75
5,576,125 A    11/1996 Bih (Continued)

FOREIGN PATENT DOCUMENTS

| JP | 06-140304 | 5/1994 |
|---|---|---|
| JP | 09-260257 | 10/1997 |
| KR | 10-2007-0081838 | 8/2007 |

OTHER PUBLICATIONS

International Search Report and Written Opinion of the International Searching Authority mailed Jul. 9, 2013 in PCT/US13/033441.

*Primary Examiner* — Tu B Hoang
*Assistant Examiner* — Alba Rosario-Aponte
(74) *Attorney, Agent, or Firm* — Patterson & Sheridan, LLP

(57) ABSTRACT

Embodiments of the invention generally relate to apparatus and methods of thermal processing of semiconductor substrates using a pellicle to eliminate contamination of an aperture member. The aperture member is disposed between an energy source and a substrate to be processed. The pellicle may be a thin piece of membrane that is substantially transparent to selected forms of energy, such as pulses of electromagnetic energy from a laser that emits radiation at one or more appropriate wavelengths for a desired period of time. In one embodiment, the pellicle is mounted at a predetermined distance from the aperture member and covering pattern openings (i.e., apertures) formed on the aperture member such that any particle contaminants that may land on the aperture member will land on the pellicle. The pellicle keeps particle contaminants out of focus in the final energy field, thereby preventing particle contaminants from being imaged onto the processed substrate.

8 Claims, 5 Drawing Sheets

(56) References Cited

U.S. PATENT DOCUMENTS

| | | |
|---|---|---|
| 6,829,035 B2 | 12/2004 | Yogev |
| 7,330,249 B2 | 2/2008 | Barotv et al. |
| 7,473,501 B1 | 1/2009 | Zhou et al. |
| 7,800,081 B2 | 9/2010 | Moffatt et al. |
| 7,927,991 B2 * | 4/2011 | Miyairi et al. ............... 438/584 |
| 8,148,663 B2 | 4/2012 | Adams et al. |
| 2004/0238502 A1 * | 12/2004 | Voutsas et al. ............. 219/121.6 |
| 2008/0057718 A1 * | 3/2008 | Omata et al. .................. 438/694 |
| 2009/0032511 A1 * | 2/2009 | Adams et al. ............ 219/121.75 |
| 2009/0120924 A1 * | 5/2009 | Moffatt et al. ................ 219/385 |
| 2010/0266268 A1 | 10/2010 | Jennings et al. |
| 2012/0325784 A1 * | 12/2012 | Moffatt et al. ........... 219/121.61 |

\* cited by examiner

APPARATUS AND METHOD TO REDUCE PARTICLES IN ADVANCED ANNEAL PROCESS

CROSS-REFERENCE TO RELATED APPLICATIONS

This application claims benefit of U.S. provisional patent application Ser. No. 61/635,136, filed Apr. 18, 2012, which is herein incorporated by reference.

BACKGROUND OF THE INVENTION

1. Field of the Invention

Embodiments described herein relate to apparatus and methods of thermal processing. More specifically, methods described herein relate to laser thermal treatment of semiconductor substrates using a pellicle to reduce contamination of an aperture member.

2. Description of the Related Art

Thermal processing is commonly practiced in the semiconductor industry. Semiconductor substrates are subjected to thermal processing in the context of many transformations, including doping, activation, and annealing of gate source, drain, and channel structures, siliciding, crystallization, oxidation, and the like. Over the years, techniques of thermal processing have progressed from simple furnace baking, to various forms of increasingly rapid thermal processing such as RTP, spike annealing, and laser annealing.

Conventional laser annealing processes use laser emitters that may be semiconductor or solid state lasers with optics that focus, defocus, or variously image the laser beam into a desired shape. A common approach is to image the laser beam into a line or thin rectangle image. The laser beam is configured to pass through an aperture member and scan across a substrate (or the substrate moved beneath the laser beam) to process one field of the substrate at a time until the entire surface of the substrate is processed. The aperture member is typically a glass plate patterned with predetermined feature geometries that block the laser beam from passing through the aperture member. The laser beam is imaged on the substrate and only the area corresponding to the unblocked area of the aperture member is processed.

A problem with this approach is that the aperture member is very sensitive to particle contaminants that may land on the aperture member during the process, causing the particles to be imaged on the substrate. Some of the laser beam may be reflected by these particle contaminants and not transmitted to the substrate.

Thus, there is a need for improved apparatus and methods for thermal processing of semiconductor substrates with high image precision without being affected by unwanted particles that may land on an aperture member during the process.

SUMMARY OF THE INVENTION

Embodiments of the invention generally relate to laser thermal treatment of semiconductor substrates using a pellicle to eliminate contamination of an aperture member. The aperture member is disposed between an energy source, such as a plurality of lasers, and a substrate to be processed. The pellicle may be a thin piece of material or membrane that is substantially transparent to selected forms of energy, such as light or laser radiation having a selected wavelength. In various embodiments, the pellicle is mounted at a predetermined distance from the aperture member and covering pattern openings (i.e., apertures) formed on the aperture member such that any particle contaminants that may land on the aperture member will land on the pellicle. The pellicle keeps particle contaminants out of focus in the final energy field, thereby preventing particle contaminants from being imaged onto the processed substrate.

In one embodiment, a method for processing a substrate is provided. The method generally includes providing a transparent plate coated with an energy blocking layer, wherein the transparent plate has a transparent sheet disposed at a predetermined distance from a front side of the transparent plate, exposing a surface of the substrate to a plurality of pulses of electromagnetic energy that pass through the transparent plate and the transparent sheet. The transparent sheet is configured to fully cover the pattern openings and prevent particle contaminants from being imaged onto the surface of the substrate.

In another embodiment, a system for processing a substrate is provided. The system generally includes a source of electromagnetic energy operable to produce pulses of electromagnetic energy, a homogenizer for adjusting spatial energy distribution of the pulses of the electromagnetic energy, an aperture member having a transparent sheet disposed at a predetermined distance from a front side of the aperture member, wherein the aperture member is coated with an energy blocking layer having pattern openings to allow the pulses of the electromagnetic energy to pass through, and an imaging module for receiving and projecting a uniform amount of electromagnetic energy on a desired region of a surface of the substrate.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

Figure 1:
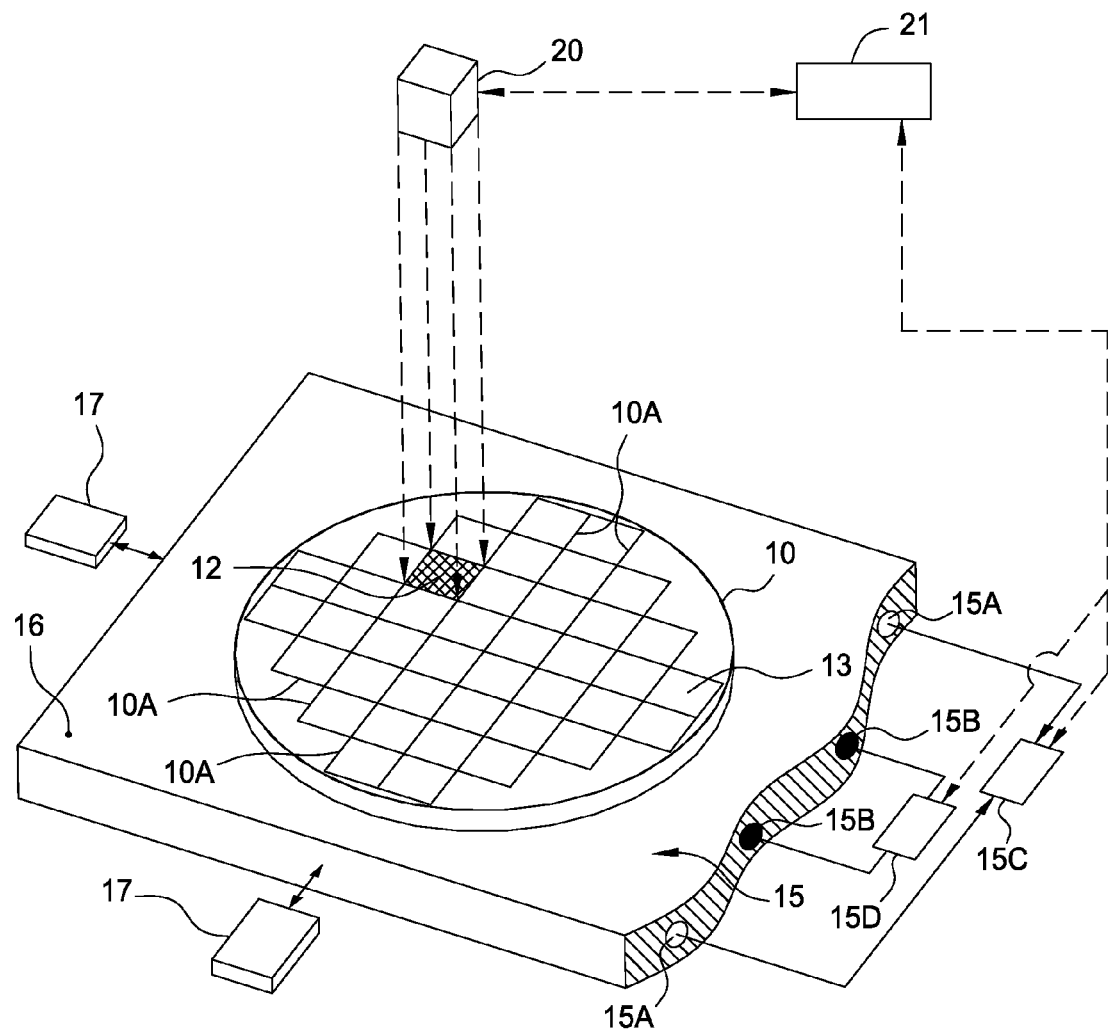
FIG. 1 illustrates an isometric view of one embodiment of the invention that may be used to practice the present invention.

FIG. 1 illustrates an isometric view of one embodiment of the invention that may be used to practice the present invention. An energy source 20 is adapted to project an amount of energy on a defined region, or an anneal region 12, of the substrate 10 to preferentially anneal certain desired regions within the anneal region 12. In the embodiment shown in FIG.

1, only one or more defined regions of the substrate, such as anneal region 12, are exposed to the radiation from the energy source 20 at any given time. In one aspect of the invention, a single area of the substrate 10 is sequentially exposed to a desired amount of energy delivered from the energy source 20 to cause preferential annealing of desired regions of the substrate. In one example, one area on the surface of the substrate after another is exposed by moving the substrate relative to the output of the electromagnetic radiation source (e.g., conventional X-Y stage, precision stages) and/or translating the output of the radiation source relative to the substrate. Typically, one or more conventional electrical actuators 17 (e.g., linear motor, lead screw and servo motor), which may be part of a separate precision stage (not shown), are used to control the movement and position of substrate 10. In another example, a complete surface of the substrate 10 is sequentially exposed all at one time (e.g., all of the anneal regions 12 are sequentially exposed).

In the embodiment shown in FIG. 1, the anneal region 12, and radiation delivered thereto, is sized to match the size of the die 13 (e.g., 40 "die" are shown in FIG. 1), or semiconductor devices (e.g., memory chip), that are formed on the surface of the substrate. In one example, the boundary of the anneal region 12 is aligned and sized to fit within the "kerf" or "scribe" lines 10A that define the boundary of each die 13. Prior to performing the annealing process, the substrate is aligned to the output of the energy source 20 using alignment marks typically found on the surface of the substrate and other conventional techniques so that the anneal region 12 can be adequately aligned to the die 13. Sequentially placing anneal regions 12 so that they only overlap in the naturally occurring unused space/boundaries between die 13, such as the scribe or kerf lines, reduces the need to overlap the energy in the areas where the devices are formed on the substrate and thus reduces the variation in the process results between the overlapping anneal regions. Therefore, the amount of process variation, due to the varying amounts of exposure to the energy delivered from the energy source 20 to process critical regions of the substrate is minimized, since any overlap of delivered energy between the sequentially placed anneal regions 12 can be minimized. In one example, each of the sequentially placed anneal regions 12 are a rectangular region that is about 22 mm by about 33 mm in size (e.g., area of 726 square millimeters ($mm^2$)). The area of each of the sequentially placed anneal regions 12 formed on the surface of the substrate may be between about 4 $mm^2$ (e.g., 2 mm×2 mm) and about 1000 $mm^2$ (e.g., 25 mm×40 mm). It is contemplated that the size of the anneal region 12 is adjustable upon the need of processing schemes.

The energy source 20 is generally adapted to deliver electromagnetic energy to preferentially anneal certain desired regions of the substrate surface. Typical sources of electromagnetic energy include, but are not limited to, an optical radiation source (e.g., laser or flash lamps), an electron beam source, an ion beam source, and/or a microwave energy source. The substrate 10 may be exposed to multiple pulses of energy from a laser that emits radiation at one or more appropriate wavelengths for a desired period of time. The multiple pulses of energy from the energy source 20 are tailored so that the amount of energy delivered across the anneal region 12 and/or the amount of energy delivered over the period of the pulse is optimized so as not to melt, or nearly melt the regions or a specific layer that has been deposited on the substrate surface. In this manner, each pulse completes a micro-anneal cycle resulting in, for example, epitaxial growth of a few lattice planes of ordered crystal near the bottom of the disordered anneal region. Alternatively, the multiple pulses of energy may be configured to melt the regions or a specific layer deposited on the substrate surface.

The wavelength of the energy source 20 may be tuned so that a significant portion of the radiation is absorbed by a layer disposed on the substrate 10. For an anneal process performed on a silicon containing layer, for example, the wavelength of the radiation may be less than about 800 nm, and can be delivered at deep ultraviolet (UV), infrared (IR) or other desirable wavelengths. In one embodiment, the energy source 20 is an intense light source, such as a laser, that is adapted to deliver radiation at a wavelength between about 500 nm and about 11 micrometers. In another embodiment, the energy source 20 may be a tungsten halogen lamp or a flash lamp featuring a plurality of radiation-emitting lamps, such as xenon, argon, or krypton discharge lamps. In such a case, a shutter may be used to manage pulses. In all cases, the energy pulse used in the anneal process generally takes place over a relatively short time, such as on the order of about 1 nsec to about 10 msec, as will be discussed in detail below.

In certain embodiments, it may be desirable to control the temperature of the substrate during thermal processing by placing a surface of the substrate 10 in thermal contact with a substrate supporting surface 16 of a heat exchanging device 15. The heat exchanging device 15 is generally adapted to heat and/or cool the substrate prior to or during the annealing process. In one example, the heat exchanging device 15 contains resistive heating elements 15A and a temperature controller 15C (which is in communication with the controller 21) that are adapted to heat a substrate disposed on a substrate supporting surface 16. The heat exchanging device 15 may also contain one or more fluid channels 15B and a cryogenic chiller 15D that are adapted to cool a substrate disposed on a substrate supporting surface 16. In one aspect, a conventional cryogenic chiller 15D, which is in communication with the controller 21, is adapted to deliver a cooling fluid through the one or more fluid channels 15B.

The controller 21 is generally designed to facilitate the control and automation of the thermal processing techniques described herein and typically may include a central processing unit (CPU) (not shown), memory (not shown), and support circuits (or I/O) (not shown). The CPU may be one of any form of computer processors that are used in industrial settings for controlling various processes and hardware (e.g., conventional electromagnetic radiation detectors, motors, laser hardware) and monitor the processes (e.g., substrate temperature, substrate support temperature, amount of energy from the pulsed laser, detector signal). The memory (not shown) is connected to the CPU, and may be one or more of a readily available memory, such as random access memory (RAM), read only memory (ROM), floppy disk, hard disk, or any other form of digital storage, local or remote. Software instructions and data can be coded and stored within the memory for instructing the CPU. The support circuits (not shown) are also connected to the CPU for supporting the processor in a conventional manner. The support circuits may include conventional cache, power supplies, clock circuits, input/output circuitry, subsystems, and the like. A program (or computer instructions) readable by the controller determines which tasks are performable on a substrate. Preferably, the program is software readable by the controller and includes code to monitor and control the substrate position, the amount of energy delivered in each electromagnetic pulse, the timing of one or more electromagnetic pulses, the intensity and wavelength as a function of time for each pulse, the temperature of various regions of the substrate, and any combination thereof.

Figure 2:
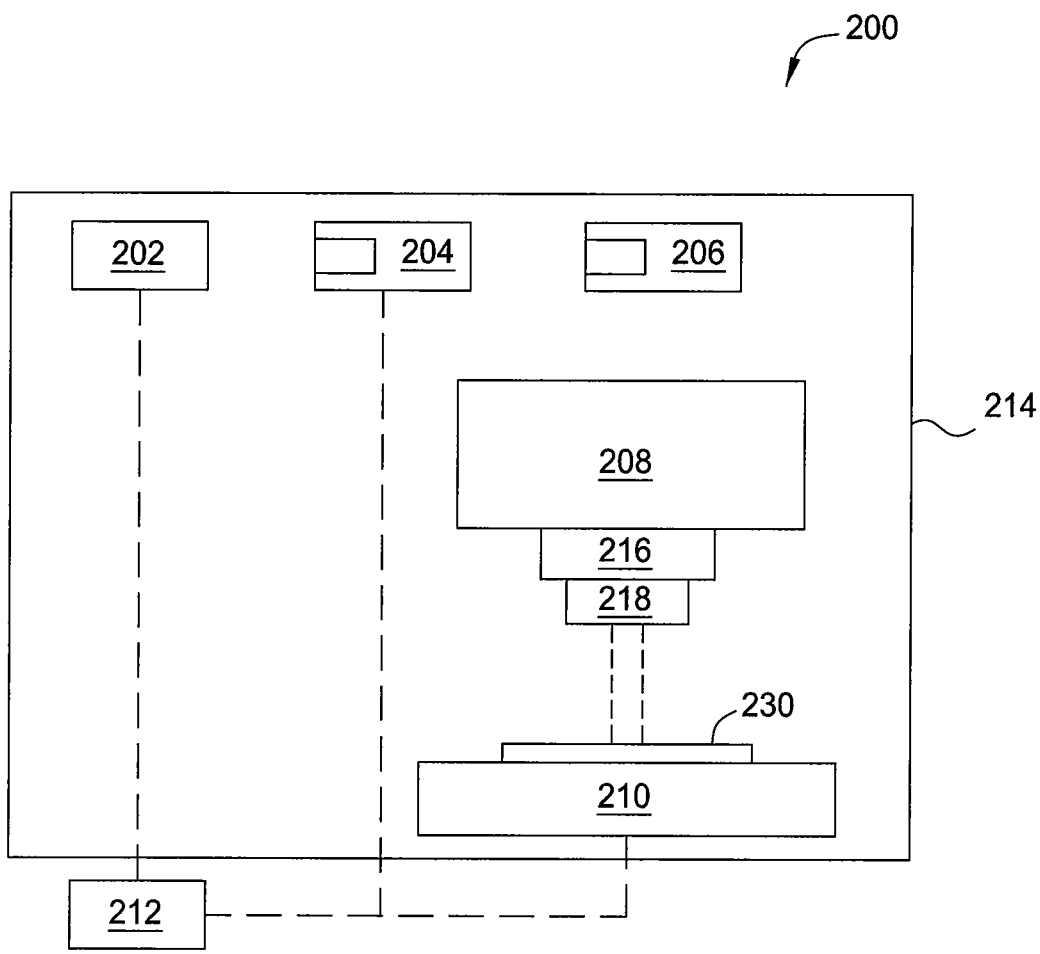
FIG. 2 illustrates a conceptual view of a system 200 for laser processing of substrates.

FIG. 2 is a conceptual view of a system 200 for laser processing of substrates. The system 200 generally includes an energy module 202 that has one or more energy sources (such as the energy source 20 described above with respect to FIG. 1) for producing a plurality of pulsed laser pulses, a pulse control module 204 that combines individual pulsed laser pulses into combination pulsed laser pulses, and that controls intensity, frequency characteristics, and polarity characteristics of the combination pulsed laser pulses, a pulse shaping module 206 that adjusts the temporal profile of the pulses of the combined pulsed laser pulses, a homogenizer 208 that adjusts the spatial energy distribution of the pulses, overlapping the combination pulsed laser pulses into a single uniform energy field, an aperture member 216 that removes residual edge non-uniformity from the energy field, and an imaging module 218 that receives the shaped, smoothed, and truncated energy field from the aperture member 216 and projects it with precision alignment of the laser energy filed with a substrate 230 disposed on a substrate support 210. A controller 212, such as the controller 21 described above with respect to FIG. 1, is coupled to the energy module 202 to control production of the laser pulses, the pulse control module 204 to control pulse characteristics, and the substrate support 210 to control movement of the substrate with respect to the energy field. An enclosure 214 typically encloses the operative components of the system 200.

It is contemplated that the system 200 may include other optical assemblies, such as lenses, filters, mirrors, and the like that are configured to focus, polarize, de-polarize, filter or adjust coherency of the energy produced by the energy source 20, with the objective of delivering a uniform column of energy to the anneal region 12 shown in FIG. 1. An example of the system 200 is further disclosed in detail in U.S. patent application Ser. No. 13/194,552, entitled "NOVEL THERMAL PROCESSING APPARATUS"), filed on Jul. 29, 2011, which is incorporated herein by reference in its entirety. An example of the suitable optical assembly that may be used in conjunction with the system 200 is further disclosed in detail in U.S. patent application Ser. No. 11/888,433, entitled "APPARATUS AND METHOD OF IMPROVING BEAM SHAPING AND BEAM HOMOGENIZATION"), filed on Jul. 31, 2007, which is incorporated herein by reference in its entirety.

The lasers may be any type of laser as discussed above that is capable of forming short pulses, for example duration less than about 500 nsec., of high power laser radiation. The lasers may be configurable to emit light at a single wavelength or at two wavelengths simultaneously, or may be configured to provide a wavelength-tunable output. Typically, high modality lasers having over 500 spatial modes with $M^2$ greater than about 30 are used. Solid state lasers such as Nd:YAG, Nd:glass, titanium-sapphire, or other rare earth doped crystal lasers are frequently used, but gas lasers such as excimer lasers, for example $XeCl_2$, ArF, or KrF lasers, may be used depending upon application. In order to realize pulsed lasers, the lasers may be switched, for example by q-switching (passive or active), gain switching, or mode locking. In one example, a switch (not shown) is used to provide pulsed lasers. The switch may be a fast shutter that can be opened or closed in 1 μsec or less, or may be an optical switch, such as an opaque crystal that becomes clear in less than 1 μsec when light of a threshold intensity impinges on it. In some embodiments, the optical switch may be configured to change state in less than 1 nsec. The optical switch generates pulses by interrupting a continuous beam of electromagnetic energy directed toward a substrate. If desired, a Pockels cell may also be used proximate the output of a laser to form pulses by interrupting a beam emitted by the laser.

In general, lasers usable for pulsed laser processing are capable of producing pulses of laser radiation having energy content between about 100 $mJ/cm^2$ and about 50 $J/cm^2$, such as between about 100 $mJ/cm^2$ and about 15 $J/cm^2$, for example between about 1 $J/cm^2$ and about 12 $J/cm^2$, for example about 10 $J/cm^2$, with a duration between about 1 nsec and about 500 nsec, such as between about 1 nsec and about 100 nsec, for example about 10 nsec to about 50 nsec. A plurality of such pulses may be applied to each portion of the substrate, with a duration between about 500 nsec and about 1 msec, such as between about 1 μsec and about 500 μsec, for example about 100 μsec, to allow complete dissipation of the thermal energy through the substrate before the next pulse arrives. The energy field typically covers an area of between about 0.1 $cm^2$ and about 10.0 $cm^2$, for example about 6 $cm^2$, resulting in a power delivery of between about 0.2 MW and about 10 GW with each pulse. In most applications, the power delivered with each pulse will be between about 10 MW and about 500 MW. The power density delivered is typically between about 2 $MW/cm^2$ and about 1 $GW/cm^2$, such as between about 5 $MW/cm^2$ and about 100 $MW/cm^2$, for example about 10 $MW/cm^2$. The energy field applied in each pulse has spatial standard deviation of intensity that is no more than about 4%, such as less than about 3.5%, for example less than about 3.0%, of the average intensity.

The lasers may have wavelength between about 200 nm and about 2,000 nm, such as between about 490 nm and about 1,100 nm, for example about 532 nm. Delivery of the high power and uniformity energy field mostly desired for annealing of substrates may be accomplished using an energy source 20 with a plurality of lasers emitting radiation readily absorbed by the substrate to be annealed. In one embodiment, the lasers are q-switched frequency-doubled Nd:YAG lasers. The lasers may all operate at the same wavelength, or one or more of the lasers may operate at different wavelengths from the other lasers in the energy module 202. In one aspect, laser radiation having a wavelength of about 532 nm is used, based on a plurality of frequency-doubled Nd:YAG lasers. The lasers may be amplified to develop the power levels desired. It is contemplated that the desired wavelength and pulse profile used in an annealing process may be determined based on optical and thermal modeling of the laser anneal process in light of the material properties of the substrate.

Figure 3A:
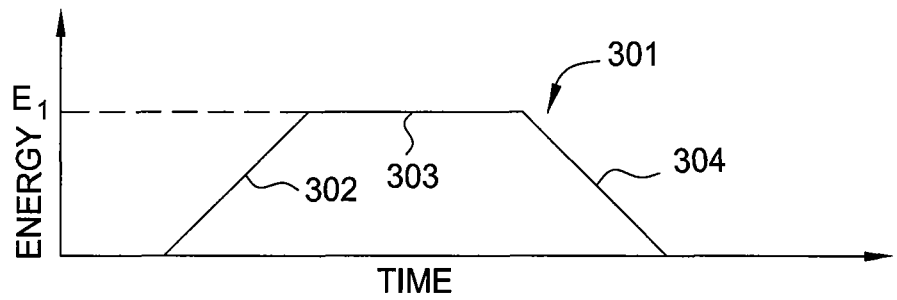
FIGS. 3A-3C illustrate various examples in which various attributes of the pulse of energy delivered from an energy source to an anneal region are adjusted as a function of time to achieve improved thermal contrast and anneal process results.
Figure 3B:
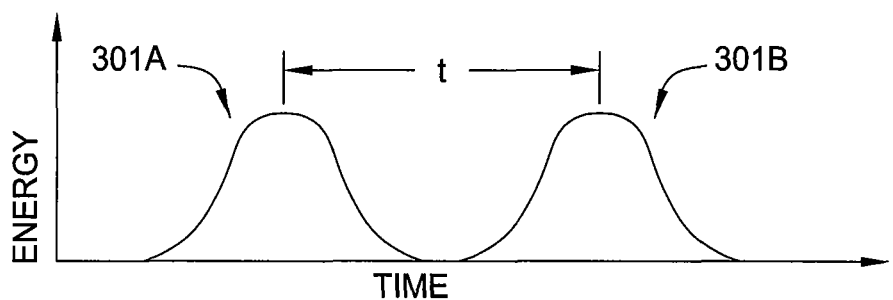
Figure 3C:
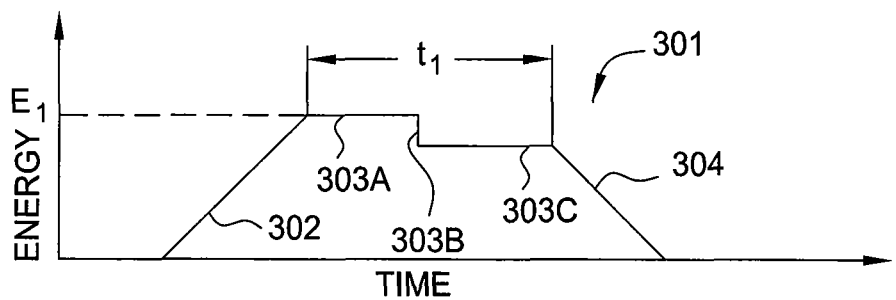

FIGS. 3A-3C illustrate various embodiments in which the various attributes of the pulse of energy delivered from an energy source 20 to an anneal region 12 (FIG. 1) are adjusted as a function of time to achieve improved thermal contrast and anneal process results. In one embodiment, it is desirable to vary the shape of a laser pulse as a function of time, and/or vary the wavelengths of the delivered energy to enhance the heat input into regions of the substrate intended to be melted and minimize the heat input into other regions. In one aspect, it may also be desirable to vary the energy delivered to the substrate.

FIG. 3A graphically illustrates a pulse of electromagnetic radiation (e.g., pulse 301) that is trapezoidal in shape. In this case, in two different segments (e.g., 302 and 304) of the pulse 301 the energy delivered is varied as a function of time. While FIG. 3A illustrates a pulse 301 profile, or shape, in which the energy versus time varies in a linear fashion, this is not intended to be limiting as to the scope of the invention since the time variation of the energy delivered in a pulse may, for example, have a second degree, third degree, or fourth degree shaped curve. In another aspect, the profile, or shape, of the energy delivered in a pulse as a function of time may be a second order, a third order, or exponential-shaped curve. In another embodiment, it may be advantageous to use a pulse having different shapes (e.g., rectangular and triangular modulation pulse, sinusoidal and rectangular modulation pulse, rectangular, triangular and sinusoidal modulation pulse, etc.) during processing to achieve the desired annealing results.

In one embodiment as shown in FIG. 3A, the slope of the segment 302, the shape of the pulse 301, the shape of the segment 303, the time at a power level (e.g., segment 303 at the energy level $E_1$), the slope of the segment 304, and/or the shape of the segment 304 are adjusted to control the annealing process. It should be noted that it is generally not desirable to cause the material within the annealed regions to vaporize during processing due to particle and process result variability concerns. It is therefore desirable to adjust the shape of the pulse of energy to rapidly bring the temperature of the annealed region to a target temperature without superheating the region and causing vaporization of the material. In one embodiment, as shown FIG. 3C, the shape of the pulse 301 may adjusted so that it has multiple segments (i.e., segments 302, 303A, 303B, 303C, and 304) are used to rapidly bring the anneal region to a target temperature and then hold the material at that temperature for a desired period of time (e.g., $t_1$), while preventing vaporization of material within the annealing region. The length of time, the shape of the segments and the duration of each of the pulse segments may vary as the size, melt depth, and the material contained within the annealing regions is varied.

In one embodiment, two or more pulses of electromagnetic radiation are delivered to a region of the substrate at differing times so that the temperature of regions on the substrate surface can be easily controlled. FIG. 3B graphically illustrates a plot of two pulses 301A and 301B that are delivered a varying distance in time apart, or period (t), to selectively heat certain regions on the surface of a substrate. In this configuration, by adjusting the period (t) between the subsequent pulses, the peak temperature reached by regions on the substrate surface can be easily controlled. For example, by reducing the period (t), or frequency, between pulses the heat delivered in the first pulse 301A has less time to dissipate before the second pulse 301B is delivered, which will cause the peak temperature achieved in the substrate to be higher than when the period between pulses is increased. By adjusting the period in this way, the energy and temperature can be easily controlled. In one aspect, it may desirable to assure that each pulse by itself does not contain enough energy to cause the substrate to reach the target temperature, but the combination of the pulses causes the annealed regions 12 (FIG. 1) to reach the target temperature. This process of delivering multiple pulses, such as two or more pulses, will tend to reduce the thermal shock experienced by the substrate material versus delivering a single pulse of energy.

Figure 4A:
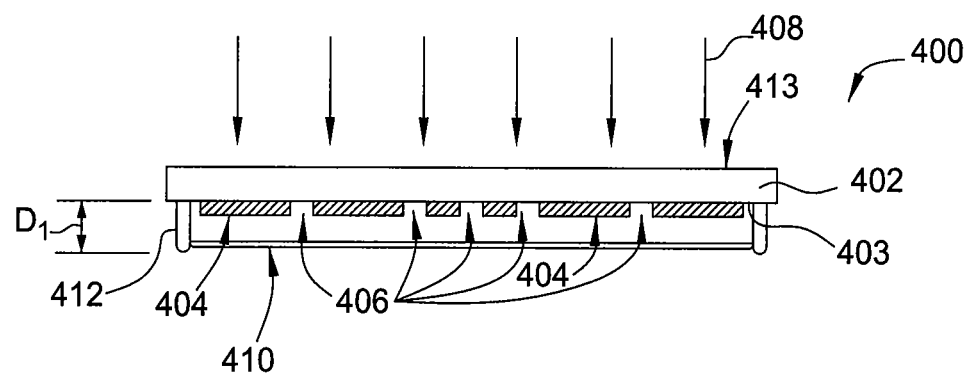
FIG. 4A illustrates a schematic side view of an aperture member according to one embodiment of the invention.

FIG. 4A is a schematic side view of an aperture member 400 according to one embodiment of the invention. The aperture member 400 may be used in place of the aperture member 216 of FIG. 2. The aperture member 400 generally includes a transparent plate 402 coated with an energy blocking layer 404. The energy blocking layer may be an opaque, light-reflective material, such as metal, white paint, or a dielectric mirror. Alternatively, the energy blocking layer may be a highly reflective coating. Suitable transparent plate 402 may include, but is not limited to glass, borosilicate glass, and fused silica. The transparent plate 402 is substantially transparent to selected forms of energy, such as light or laser radiation having a selected wavelength. The energy blocking layer 404 may be formed by depositing a light-absorbing layer or a light-reflecting layer on a front side 403 of the plate 402. The light-absorbing or light-reflecting layer is subsequently etched using etching methods known in the art to remove portions of the light-absorbing or light-reflecting layer to produce pattern openings 406 (also called apertures). During the process, electromagnetic radiation 408 from a radiation source (not shown, such as the energy source 20 shown in FIG. 1) passes through a homogenizer (not shown, such as the homogenizer 208 shown in FIG. 2) where the energy is arranged in a pattern, such as a rectangular or square shape as shown in FIG. 1, that approximately fits an area to be annealed on the surface of a substrate. Electromagnetic radiation 408 then passes through pattern openings 406 in which the light-absorbing or light-reflecting layer has been removed and hits onto an imaging module, such as the imaging module 218 described above with respect to FIG. 1. The imaging module receives the shaped, smoothed, and truncated energy field from the aperture member 400 and projects it onto a surface of a substrate (not shown) to be annealed.

It is contemplated that the aperture member 400 may vary in size. Also, pattern openings 406 may have a binary pattern, i.e., a pattern used to make integrated circuits or other desired device features on the substrate. Pattern openings 406 can be configured to provide variable aperture size depending upon application. While not shown, multiple aperture members having different aperture sizes may be provided to allow changing the size of the energy field to anneal areas having different sizes.

In one embodiment of the present invention, pattern openings 406 formed on the front side 403 of the transparent plate 402 is covered by a protective material, called a pellicle 410. Pellicles are typically flat, transparent membranes or sheets made of an organic material such as nitrocellulose, cellulose acetate, or fluorocarbon-based polymers. The material of the pellicle 410 may be chosen for use with incident electromagnetic energy within a range of wavelengths that extends at least between about 200 nm and about 2,000 nm, such as between about 400 nm and about 1,000 nm, for example about 532 nm. For example, the pellicle 410 may be formed of glass, quartz, or fused silica to provide superior resistance to the adverse affects of electromagnetic energy, gaseous precursors, or moisture from the atmosphere. The pellicle 410 is stretched across a frame 412 that is mounted onto the front side 403 of the transparent plate 402. The pellicle 410 may be securely fastened to the frame 412 via an adhesive or tape (not shown). The frame 412 may be a single-walled frame of metal, metal alloy, or plastic. The pellicle 410 is placed at a fixed distance from the front side 403 of the transparent plate 402. In one example, the distance D1 between the pellicle 410 and the transparent plate 402 is about 2 mm to about 20 mm, for example about 6 mm. The pellicle 410 may have a thickness ranging from about 5 μm to about 500 μm. The thinness of the pellicle 410 eliminates the need for an anti-reflective coating and allows the pellicle 410 to be positioned flat across the frame 412 to cover entire pattern openings 406. Covering the pattern openings 406 with the pellicle 410 and enclosing the edges of the aperture member 400 with the frame 412 ensure that particles and/or other contaminants do not enter and fall onto the front side 403 of the transparent plate 402. This serves to keep any particle contaminants out of focus in the final energy field (i.e., substrate surface) so that variation in intensity of the final energy field due to the shadows of the particles is reduced. The pellicle 410 therefore prevents particle contaminants from being imaged onto the substrate. These particle contaminants can then be removed without requiring cleaning of the surface of the transparent plate 402.

Figure 4B:
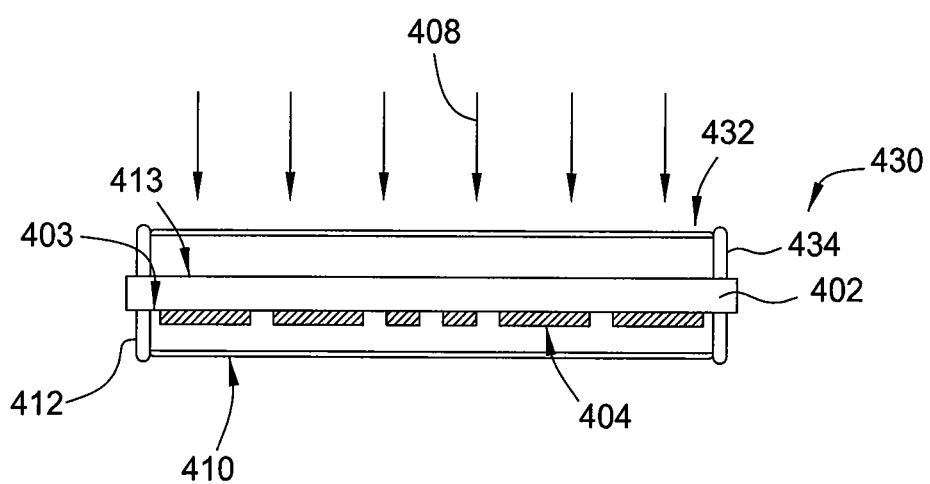
FIG. 4B illustrates a schematic side view of an aperture member according to another embodiment of the invention.

FIG. 4B is a schematic side view of an aperture member 430 according to another embodiment of the invention. The aperture member 430 is similar to the aperture member 400, except that an additional pellicle 432 and an additional frame 434 are mounted onto a back side 413 of the transparent plate 402 facing the radiation source (not shown), i.e., opposite the front side 403 of the transparent plate 402 facing the pellicle 410. The pellicle 432 may be the same material and size as the pellicle 410. The edges of the aperture member 430 are enclosed by the frame 434 that ensures particulates do not fall on the back side 413 of the transparent plate 402. The combination of pellicle 410 and pellicle 432 provides dust-proof protection of the aperture member 430.

The aperture members 400 and 430 may magnify or reduce the image of the light passing through the aperture in any desired way. The aperture members may have magnification factor of 1:1, which is essentially no magnification, or may reduce the image in size by a factor of between about 1.1:1 and about 5:1, for example, about 2:1 or about 4:1. Reduction in size may be useful for some embodiments because the edges of the imaged energy field may be sharpened by the size reduction. Magnification by a factor between about 1:1.1 and about 1:5, for example about 1:2, may be useful in some embodiments to improve efficiency and throughput by increasing coverage area of the imaged energy field.

Figure 5:
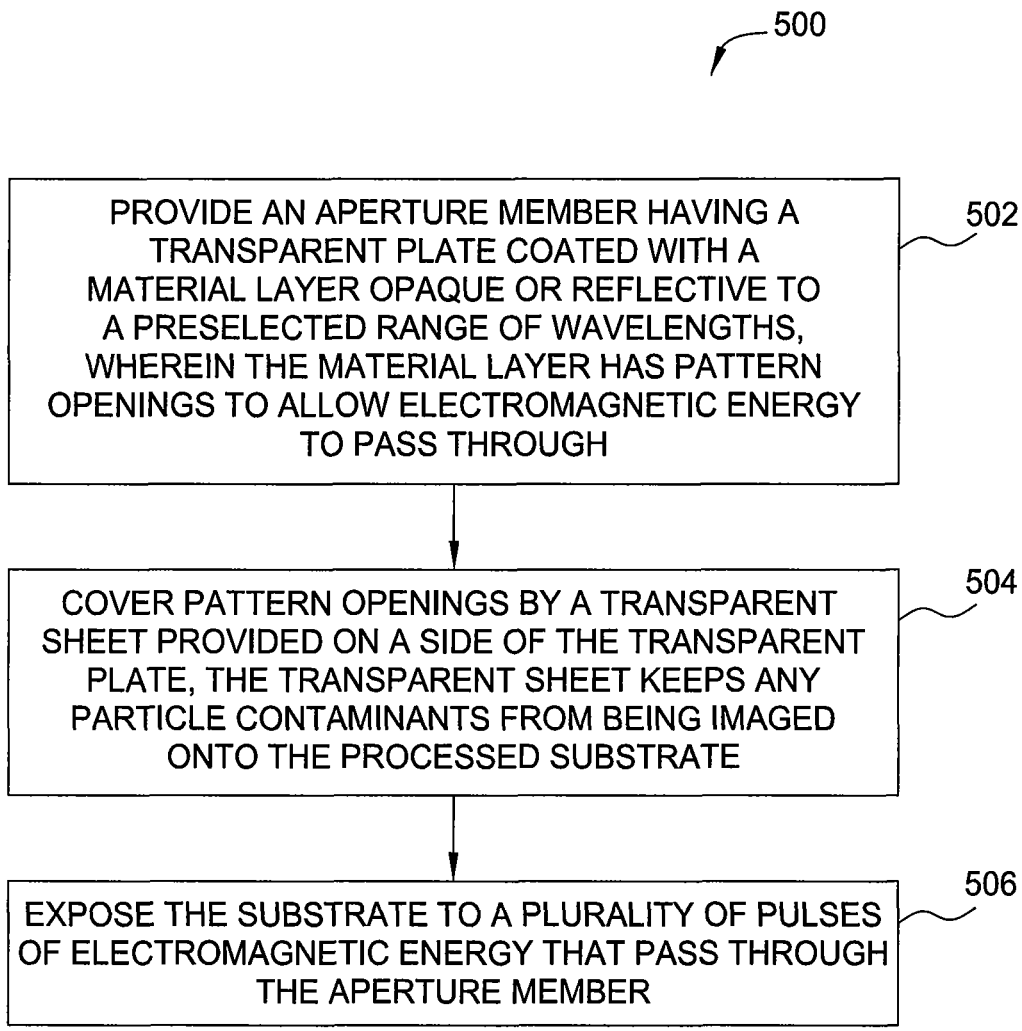
FIG. 5 is a flow diagram illustrating a process for laser processing of a substrate according to one embodiment of the invention.

FIG. 5 is a flow diagram 500 illustrating a process for laser processing of a substrate according to one embodiment of the invention. The flow diagram 500 described herein may be performed in conjunction with various embodiments discussed above with respect to FIGS. 1, 2, 3A-3C, and 4A-4B. It should be noted that the number and sequence of steps illustrated in FIG. 5 are not intended to limiting as to the scope of the invention described herein, since one or more steps may be added, deleted and/or reordered without deviating from the basic scope of the invention.

The flow diagram 500 begins at box 502, in which an aperture member having a transparent plate coated with an energy blocking layer opaque or reflective to a preselected range of wavelengths is provided. The transparent plate and the energy blocking layer may be the transparent plate 402 and the energy blocking layer 404 as discussed above. The energy blocking layer may be formed with pattern openings (i.e., apertures) to allow electromagnetic energy to pass through. Pattern openings may have a pattern used to make integrated circuits or other desired device features on the substrate. Pattern openings may be configured to provide variable aperture size depending upon application.

At box 504, a transparent membrane or sheet is stretched across a frame mounted on a front side of the transparent plate. The transparent membrane or sheet is raised several millimeters from the front side of the transparent plate and covering the pattern openings. The transparent membrane or sheet may be the pellicle 410 as discussed above with respect to FIGS. 4A and 4B to provide necessary sustainability and resistance to the adverse affects of electromagnetic energy, gaseous precursors, or moisture from the atmosphere. The transparent membrane or sheet is configured to ensure that particles and/or other contaminants that may land on the pattern openings will land on the transparent membrane or sheet, which keeps particle contaminants out of focus in the final energy field, thereby preventing particle contaminants from being imaged onto the substrate.

At box 506, the substrate is exposed to a pulse of energy that passes through the transparent plate, pattern openings, and the transparent membrane or sheet. It is contemplated that the pulse of electromagnetic energy may also pass through pulse control or shaping modules and various optical components that are arranged upstream or downstream of the aperture member. The substrate may be exposed to a plurality of pulses of electromagnetic energy that emit radiation at one or more appropriate wavelengths, and the emitted radiation has a desired energy density and/or pulse duration as discussed above. Sources of electromagnetic energy may include, but are not limited to an optical radiation source, an electron beam source, an ion beam source, and/or a microwave energy source. The plurality of pulses of electromagnetic energy is directed toward a portion of the substrate to anneal the substrate, as discussed above with respect to FIGS. 1 and 2.

One advantage of the present invention is that pattern openings (i.e., apertures) formed on a transparent plate of an aperture member is fully protected by a transparent membrane or sheet that is placed several millimeters from the front side of the transparent plate. The transparent membrane or sheet keeps particle contaminants out of focus in the final energy field, thereby preventing particle contaminants from being imaged onto the substrate. As the transparent membrane or sheet prevents particle contaminants from collecting in the image plane of the pattern openings that is to be transferred to the substrate, any particles or contaminants land on the transparent membrane or sheet will have negligible effect on the processed substrate.

While the foregoing is directed to embodiments of the present invention, other and further embodiments of the invention may be devised without departing from the basic scope thereof, and the scope thereof is determined by the claims that follow.

The invention claimed is:

1. A system for processing a substrate, comprising:
   a source of electromagnetic energy operable to produce pulses of electromagnetic energy; and
   a first transparent plate coupling to a transparent sheet disposed parallel to the transparent plate at a distance from a first surface of the transparent plate, the transparent plate is coated with an energy blocking layer having pattern openings to allow the pulses of the electromagnetic energy to pass through, wherein the first transparent sheet is not in physical contact with the energy blocking layer, and wherein the energy blocking layer is opaque or reflective to a preselected range of wavelengths between about 200 nm and about 2,000 nm; and
   a second transparent sheet disposed at a distance from a second surface of the transparent plate, wherein the second transparent sheet is supported by a second frame mounted onto the second surface of the transparent plate.

2. The system of claim 1, wherein the first transparent sheet is supported by a frame mounted onto the first surface of the transparent plate, and the distance is between about 2 mm and about 20 mm.

3. The system of claim 1, wherein each pulse of electromagnetic energy has energy less than that required to melt or nearly melt a portion of a layer deposited on the surface of the substrate.

4. The system of claim 1, wherein each pulse has energy of about 100 mJ/cm$^2$ to about 10 J/cm$^2$ and each pulse is delivered with a duration between about 1 nsec and about 100 nsec.

5. An aperture member for used in a thermal processing chamber, comprising:
   a transparent plate having a first surface and a second surface opposing the first surface;
   a first transparent sheet disposed at a distance from the first surface of the transparent plate, wherein the first transparent sheet is supported by a first frame mounted onto the first surface of the transparent plate;

an energy blocking layer disposed on the second surface of the transparent plate, the energy blocking layer having patterned openings allowing for a plurality of pulses of laser radiation having a wavelength of between about 490 nm and about 1100 nm to pass through; and a second transparent sheet coupled to the second surface of the transparent plate through a second frame, wherein the second transparent sheet is disposed parallel to the transparent plate at a distance and covers the patterned openings, and the second transparent sheet is not in physical contact with the energy blocking layer.

6. The aperture member of claim 5, wherein each transparent sheet is selected from the group consisting of nitrocellulose, cellulose acetate, fluorocarbon-based polymers, glass quartz, and fused silica.

7. The aperture member of claim 5, wherein the distance is between 2 mm and about 20 mm.

8. The aperture member of claim 5, wherein each pulse of laser radiation has energy of about 100 $mJ/cm^2$ to about 10 $J/cm^2$ and each pulse is delivered with a duration between about 1 nsec and about 100 nsec.

\* \* \* \* \*

UNITED STATES PATENT AND TRADEMARK OFFICE
CERTIFICATE OF CORRECTION

PATENT NO. : 9,214,346 B2  Page 1 of 1
APPLICATION NO. : 13/849097
DATED : December 15, 2015
INVENTOR(S) : Amikam Sade It is certified that error appears in the above-identified patent and that said Letters Patent is hereby corrected as shown below:

In the Claims:

Column 10, Claim 1, Line 34, please delete "first" before transparent plate;

Column 10, Claim 1, Line 34, please insert -- first -- before transparent sheet;

Column 11, Claim 7, Line 17, please insert -- about -- before 2 mm.

Signed and Sealed this
Twelfth Day of April, 2016

Michelle K. Lee
*Director of the United States Patent and Trademark Office*